(12) United States Patent
Kolb et al.

(10) Patent No.: US 8,466,061 B2
(45) Date of Patent: Jun. 18, 2013

(54) METHOD FOR FORMING A THROUGH VIA IN A SEMICONDUCTOR ELEMENT AND SEMICONDUCTOR ELEMENT COMPRISING THE SAME

(75) Inventors: Stefan Kolb, Unterschleissheim (DE); Bernhard Winkler, Regensburg (DE); Ivo Rangelow, Baunatal (DE); Hans-Olof Blom, Uppsala (SE); Johan Bjurstroem, Uppsala (SE)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 12/888,761

(22) Filed: Sep. 23, 2010

(65) Prior Publication Data
US 2012/0074570 A1    Mar. 29, 2012

(51) Int. Cl.
*H01L 21/44* (2006.01)
(52) U.S. Cl.
USPC .................................. 438/667; 257/E21.597
(58) Field of Classification Search
USPC ........................... 438/667, 680; 257/E21.597
See application file for complete search history.

(56) References Cited

U.S. PATENT DOCUMENTS

| 4,773,945 | A | * | 9/1988 | Woolf et al. ................. 136/256 |
| 5,608,264 | A | | 3/1997 | Gaul |
| 5,646,067 | A | | 7/1997 | Gaul |
| 5,766,984 | A | | 6/1998 | Ramm et al. |
| 5,929,525 | A | | 7/1999 | Lin |
| 6,110,825 | A | * | 8/2000 | Mastromatteo et al. ...... 438/667 |
| 2005/0139954 | A1 | | 6/2005 | Pyo |
| 2007/0004121 | A1 | | 1/2007 | Eckstein et al. |
| 2008/0067562 | A1 | | 3/2008 | Kawasaki |
| 2009/0017630 | A1 | | 1/2009 | Lee et al. |

FOREIGN PATENT DOCUMENTS

WO    2004109770 A2    12/2004

* cited by examiner

*Primary Examiner* — Quoc Hoang
(74) *Attorney, Agent, or Firm* — Eschweiler & Associates, LLC

(57) ABSTRACT

A method for forming a through via in a semiconductor element includes providing a semiconductor element having electronic circuitry integrated on the main side thereof. The semiconductor element further includes an etch stop layer and a conductive region, wherein the conductive region is arranged between the etch stop layer and the main side of the semiconductor element. The method also includes selectively etching a through via from a backside of the semiconductor element, opposite to the main side of the semiconductor element, to the etch stop layer and removing at least partly the etch stop layer, so that the conductive region is exposed to the backside and filling at least partly the through via with a conductive material, wherein the conductive material is electrically isolated from the semiconductor element.

12 Claims, 6 Drawing Sheets

METHOD FOR FORMING A THROUGH VIA IN A SEMICONDUCTOR ELEMENT AND SEMICONDUCTOR ELEMENT COMPRISING THE SAME

TECHNICAL FIELD

Embodiments of the invention concern the field of forming a through via in a semiconductor element and semiconductor elements comprising such a through via.

BACKGROUND

Technological innovations in semiconductor device fabrication are driving market demands for solutions for higher speed, higher integration density and lower power applications. In order to fulfill this requirement wafers or semiconductor elements in general can be stacked. One possibility to electrically connect such stacked wafers or semiconductor elements includes forming through vias in the wafers or semiconductor elements to achieve an electrical connection from a backside of a wafer or semiconductor element to a main side or upper side comprising electrical circuitry. During the formation of a through via a couple of difficulties may arise. For example, one difficulty may be that if the through via process is applied at the very beginning of the wafer processing a metallic filling of the "wafer holes" or through vias or a highly doped filling of such wafer holes would not be compatible with the following semiconductor fabrication process. Otherwise, complex sealing processes of such wafer holes for the highly doped material or metal would be necessary. If the through via process is applied at the very end of the semiconductor processing another difficulty may arise. In this case, for example, the temperature budget, necessary for an appropriate isolation of the wafer substrate to a through hole via filling, could damage the semiconductor devices of the integrated circuit, which is formed in the wafer substrate at this stage of wafer processing.

So far, solutions integrating the through via process in a overall integrated wafer process, for example, in a complementary-metal-oxide semiconductor (CMOS) process or bipolar-complementary-metal-oxide semiconductor (BiCMOS) may result in a loss of process modularity. In this case the through via process and logic process cannot be separated which may cause problems disadvantageously concerning fabrication equipment, yield loss and so on.

Using partially preprocessed through vias with a polysilicon filling, through vias may be opened with wafer grinding at process end. In this case, a complex sealing of the doped polysilicon is necessary to prevent the following semiconductor process steps from contamination. Normally no metal filling of the through vias is possible without a highly complex and risky sealing of the metal. Alternatively, highly doped substrates may be used with integrated through vias. Such highly doped substrates may be used at the beginning of the integrated process to form the electrical devices of the integrated circuits. But due to device isolation issues such highly doped substrates are hardly compatible or even not compatible to integrated CMOS or BiCMOS processes without additional effort.

Therefore, there is a demand for an improved method for forming a through via in a semiconductor element.

DETAILED DESCRIPTION

Figure 1:
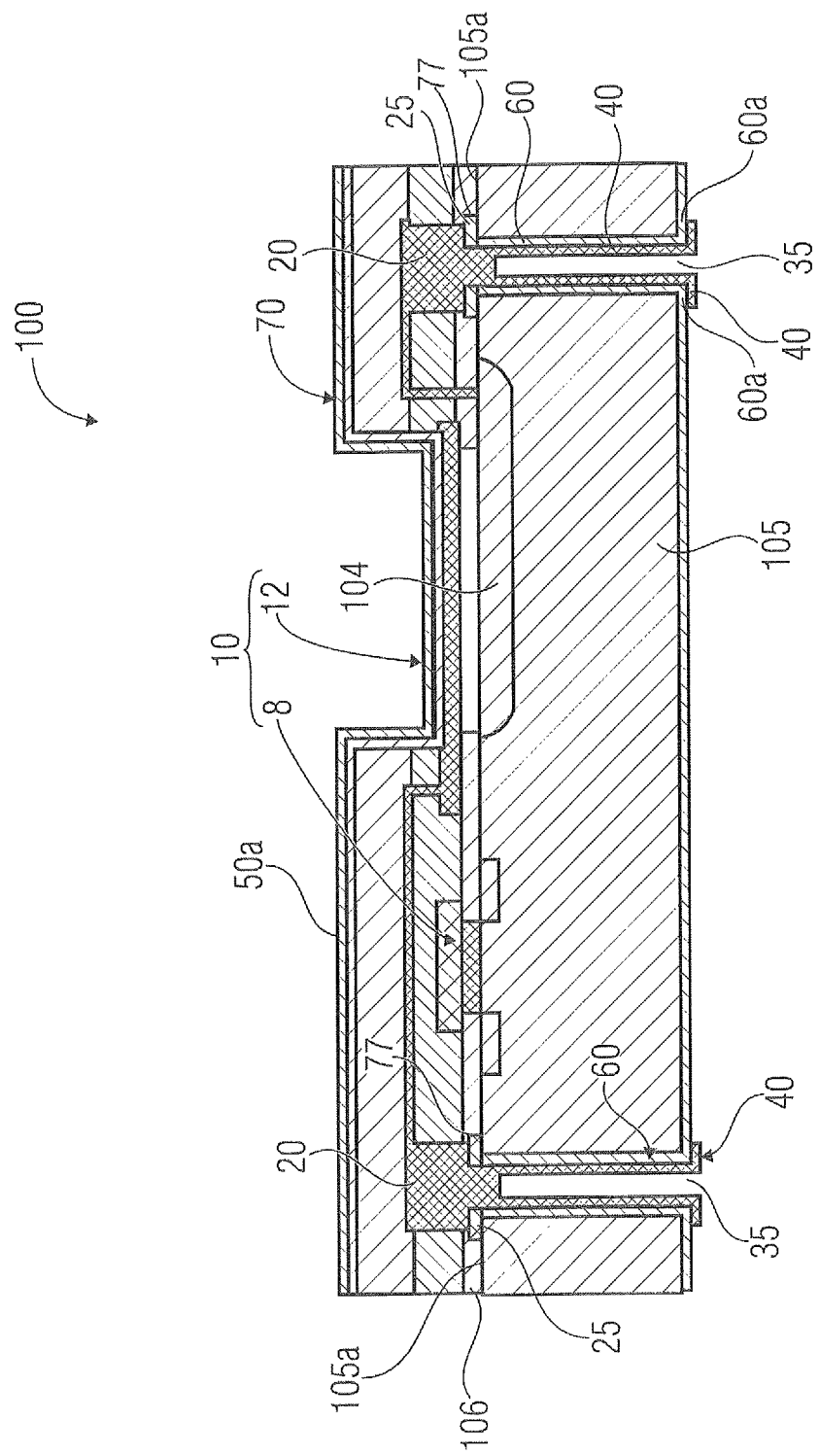
FIG. 1 shows a schematic cross sectional view of a semiconductor element having electronic circuitry integrated thereon and having through vias electrically connecting a backside of the semiconductor element with the electronic circuitry.
Figure 2A:
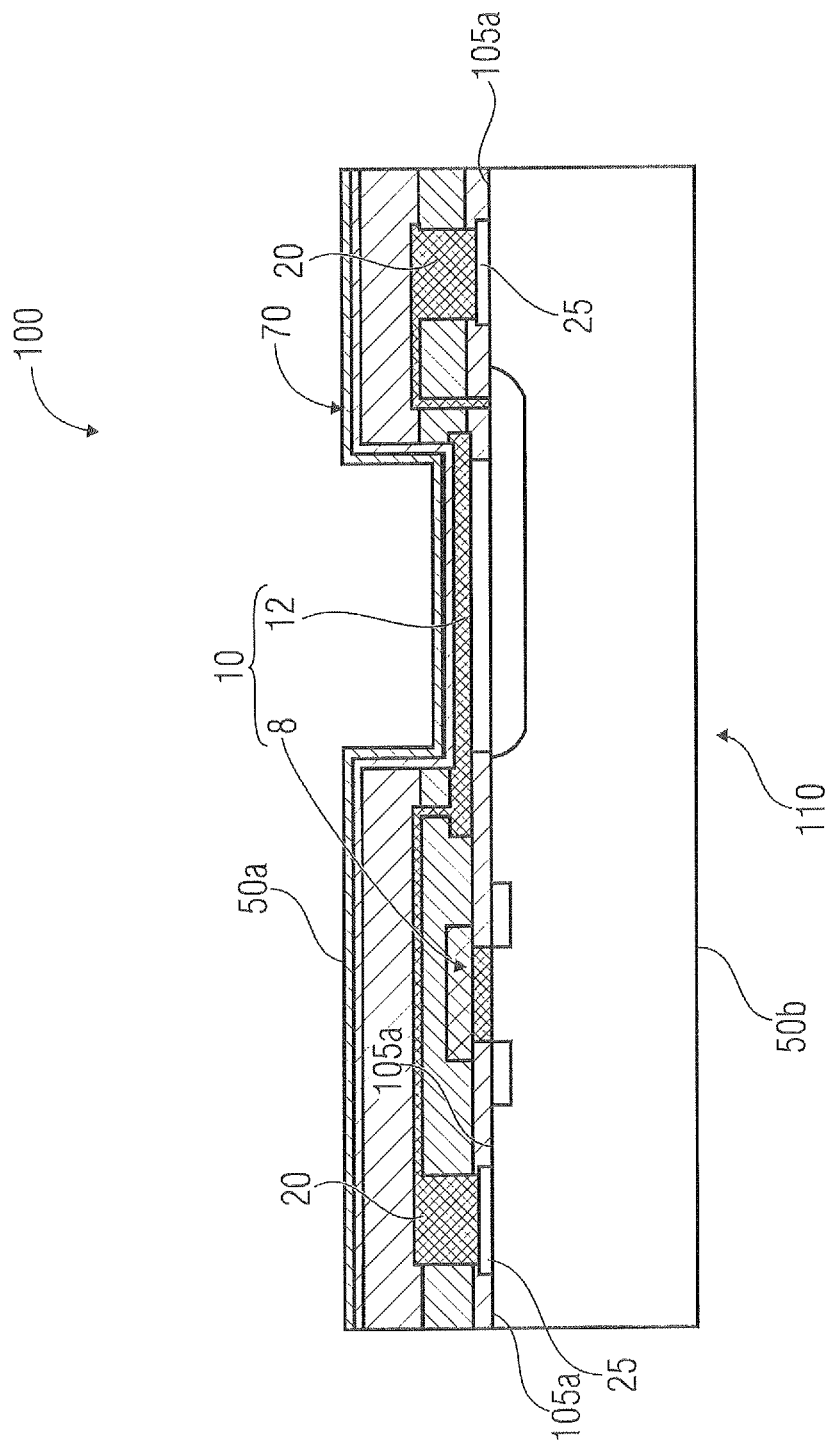
FIG. 2*a* shows a schematic cross-sectional view of a semiconductor element having electronic circuitry integrated thereon.
Figure 2B:
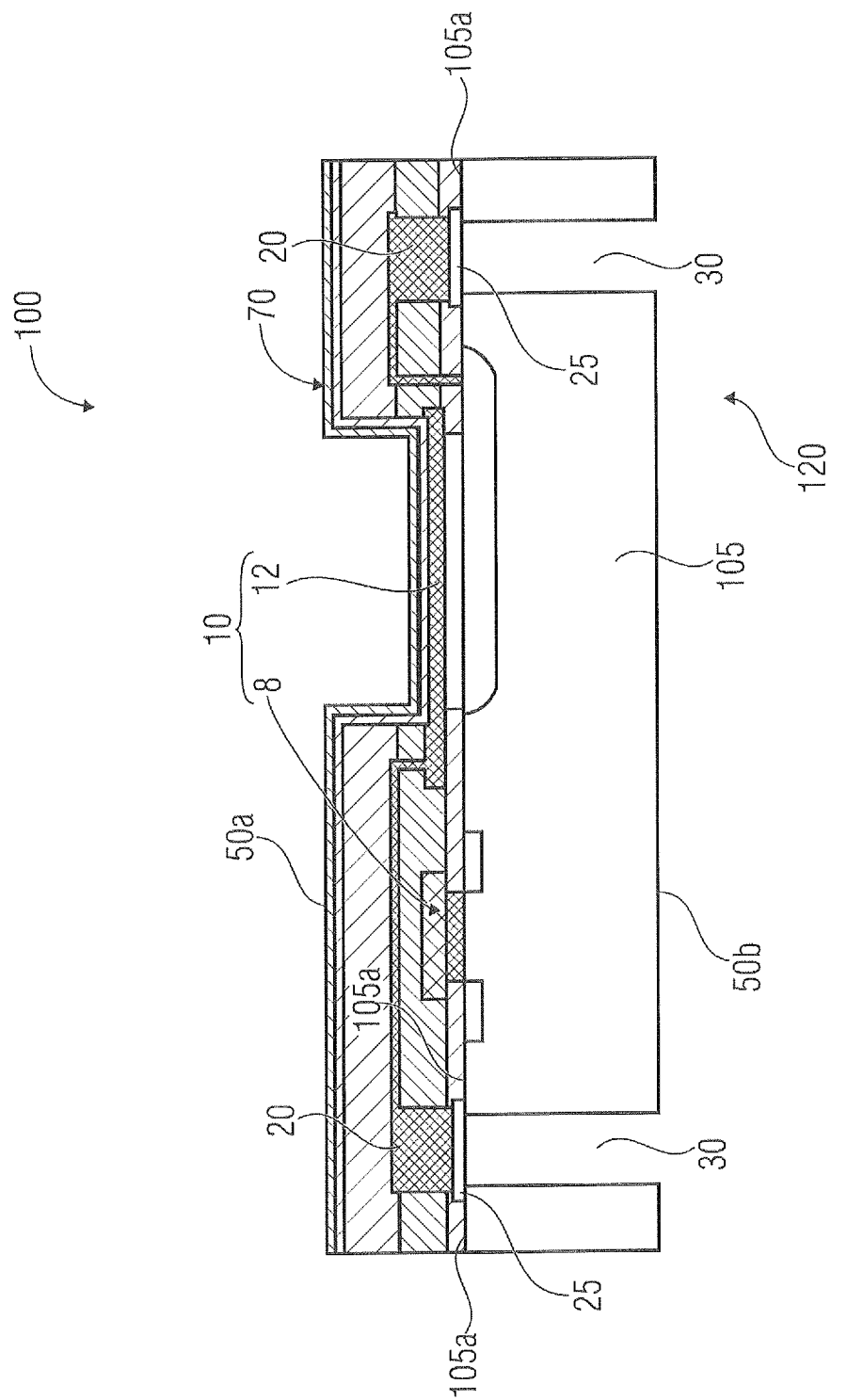
FIG. 2*b* shows a schematic cross-sectional view of a semiconductor element having electronic circuitry integrated thereon and through holes etched from the backside of the semiconductor element.
Figure 2C:
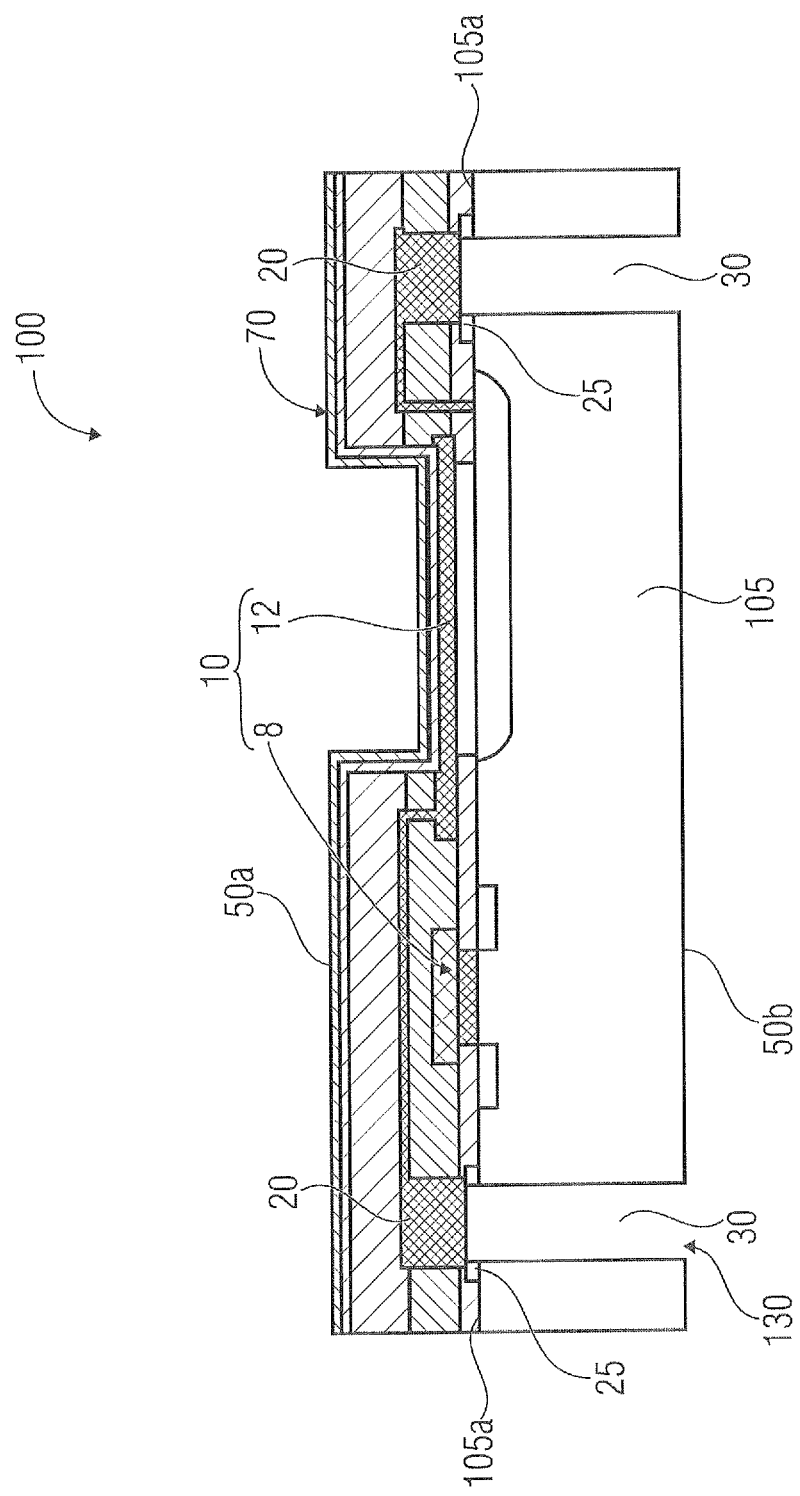
FIG. 2*c* shows a schematic cross-sectional view of a semiconductor element having electronic circuitry integrated thereon and conductive regions exposed by the through holes to the backside of the semiconductor element.
Figure 2D:
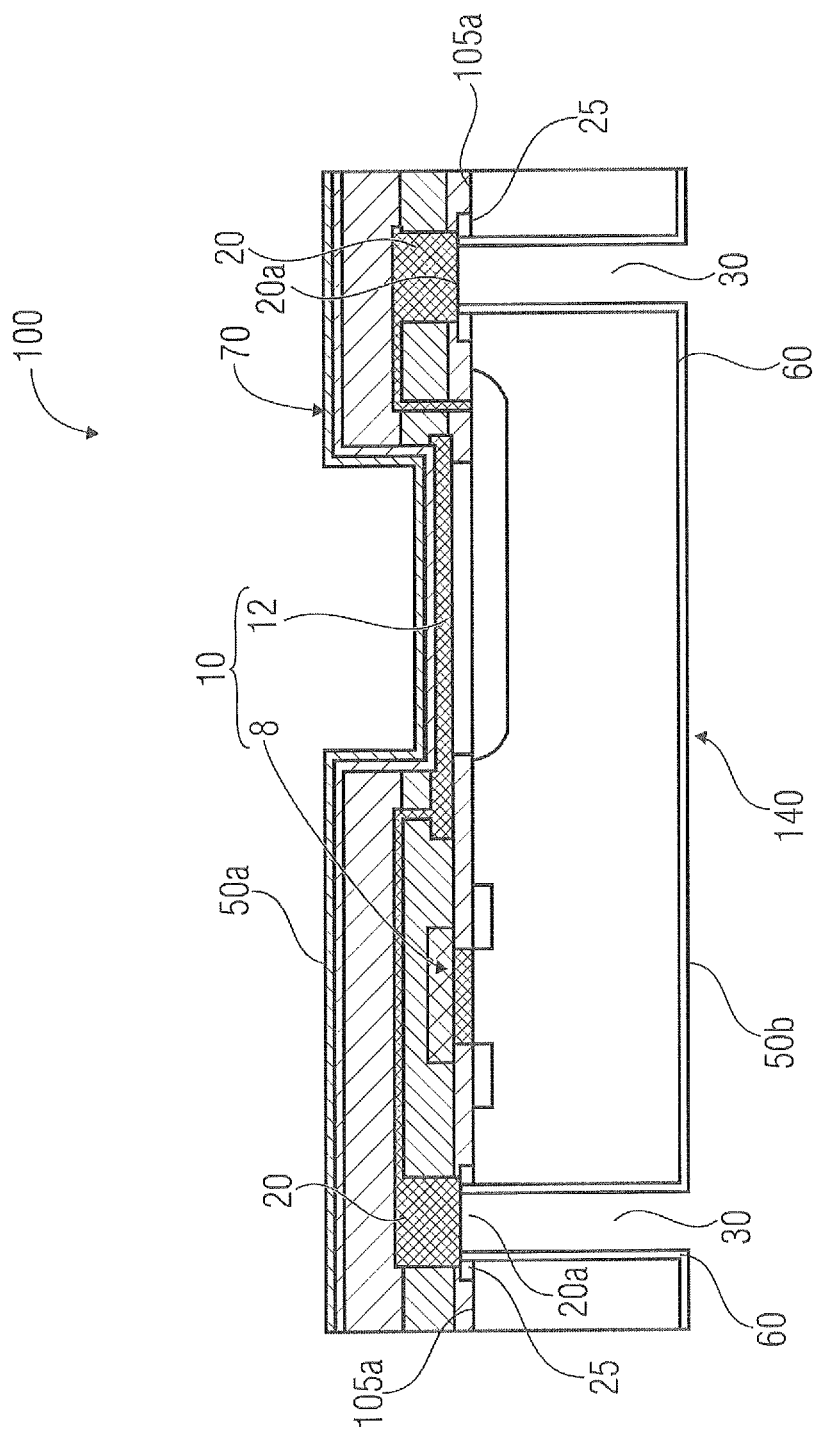
FIG. 2*d* shows a schematic cross-sectional view of a semiconductor element having electronic circuitry integrated thereon and a through hole formed from the backside to the main side of the semiconductor element, wherein the through hole and backside of the semiconductor element are covered with an isolation layer.
Figure 2E:
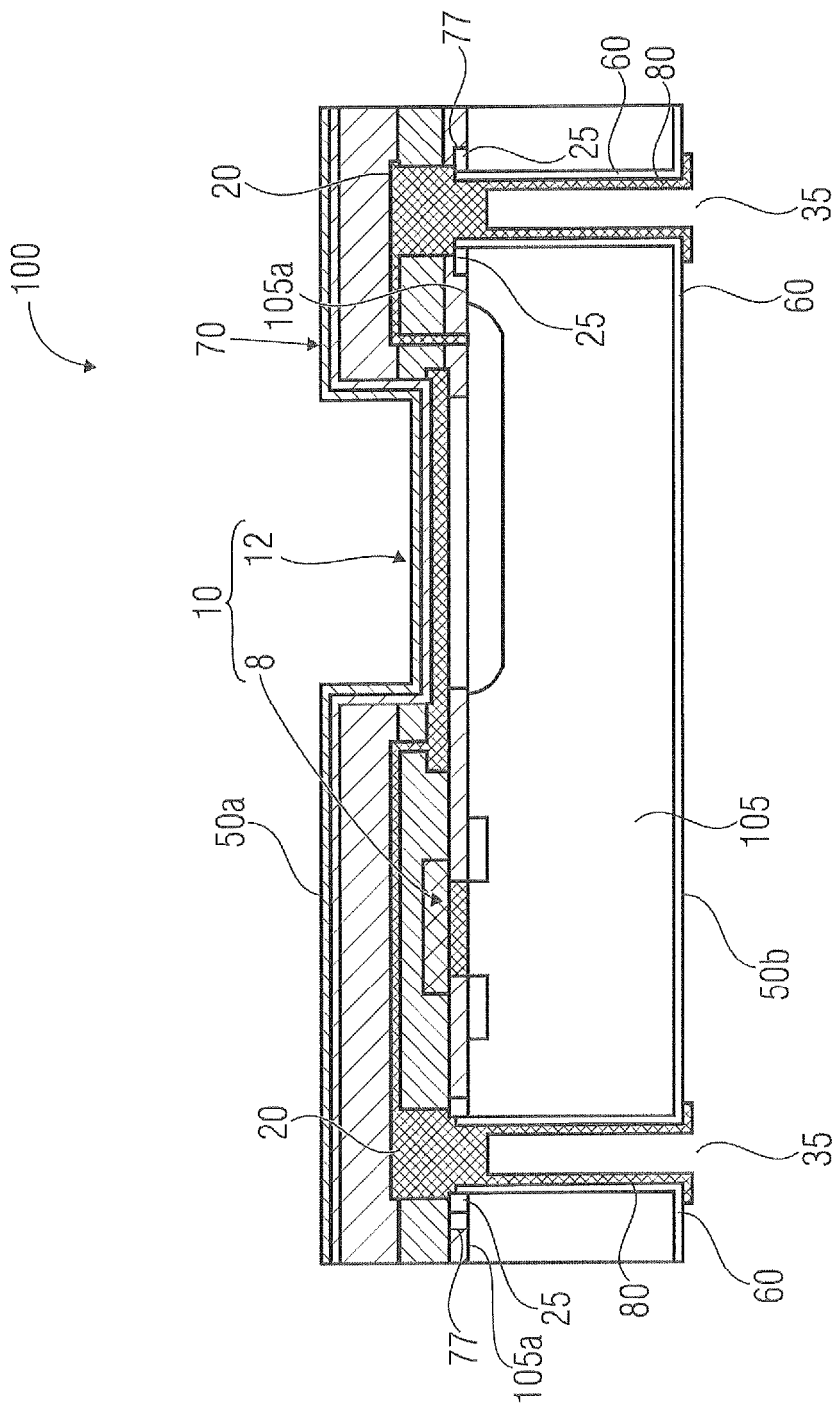
FIG. 2*e* shows a schematic cross-sectional view of a semiconductor element having electronic circuitry integrated thereon and a through via at least partially filled with a conductive material such that an electrical contact from the backside of the semiconductor element to the conductive region at the main side is formed.

With reference to FIGS. 1 to 2*e*, embodiments are shown, which relate to a method for forming a through via in a semiconductor element and to a semiconductor element comprising such a through via.

According to an embodiment, in FIG. 1 a schematic cross-sectional view of a semiconductor element 100 comprising an electronic circuitry 10 integrated at a main side or upper side 50*a* of the semiconductor element 100 is shown. The main side may be the side of the wafer or semiconductor element which comprises the electronic circuitry 10 integrated therein. The semiconductor element further comprises a through via 35 being formed from a backside 50*b* of the semiconductor element 100, opposite to a main side 50*a* of the semiconductor element 100, to a conductive region 20. The conductive region 20 may be spaced apart from a semiconductor substrate main surface 105*a*. This means, there may be a certain distance 77 or gap between the semiconductor substrate main surface 105*a* and the conductive region 20. The distance or gap 77 may correspond to a layer, e.g. an etch stop layer 25 that may be arranged between the conductive region 20 and the semiconductor substrate main surface 105*a*. The etch stop layer 25 may be in direct contact with the semiconductor substrate main surface 105*a* and/or in direct contact with the conductive region 20. The distance between the conductive region 20 and the semiconductor substrate main surface 105*a* may be, for example, between 0.5 nm and 1 μm, between 5 nm and 500 nm or between 10 nm and 200 nm. This distance 77 may correspond to a thickness of the etch stop layer 25. The etch stop layer 25 may be a dielectric isolation layer, for example, an oxide layer, e.g. a field-oxide layer, a nitride layer or an organic layer. The etch stop layer may be arranged at the semiconductor substrate main surface 105*a*, for example, at a silicon substrate main surface. The through via 35 is at least partly filled with a conductive material 40 so that an electrical connection from the backside 50*b* of the semiconductor element to the main side 50*a* of the semiconductor element is given. Between the conductive material 40 and the semiconductor element an isolation layer 60 may be arranged. This means, the through via 35 may comprise an isolation layer 60 which is at least covering the side walls of a through hole 30 so that a conductive filling of the through via 35 is electrically isolated from the semiconductor substrate 105 or semiconductor material of the semiconductor element 100. The isolation layer 60 may be generated, for example, by means of a low-pressure-chemical-vapor-deposition (LPCVD) method so that the isolation layer 60 comprises an uniform thickness with a deviation or tolerance smaller than 80%, smaller than 50%, smaller than 40% or smaller than 25%. This means that the thickness of the isolation layer 60 that covers, e.g. the side walls or the bottom, comprises a variation smaller than 50%, smaller than 40% or smaller than 25%. The isolation layer 60 may be conformally deposited or aligned to the edge 60a of the through hole 30 at the backside 50b of the semiconductor element 100. The isolation layer in this through hole may be formed by means of LPCVD so that the edge 60a at the backside 50b of the semiconductor element is covered conformally with the isolation layer 60. A conformal edge coverage of the semiconductor substrate with the isolation layer 60 can be achieved using LPCVD for the deposition of the isolation layer 60.

In one embodiment, the isolation layer 60 may be produced in a Tetra-Ethyl-Ortho-Silicate (TEOS) process applying a LPCVD. The isolation layer may be, for example, a silicon dioxide layer, or according to other embodiments the isolation layer may comprise nitride, oxide, glass or organic material. The isolation layer may be fabricated by applying a CVD process or other semiconductor processes suitable to generate such a isolation layer. A TEOS-process for forming the isolation layer 60 may be performed at a temperature higher than 500° C., for example between 700° C. and 1500° C. or between 800° C. and 1000° C.

In one embodiment, the semiconductor element 100 may comprise, e.g. silicon (Si), gallium arsenide (GaAs), indium phosphide (InP), silicon carbide (SiC), silicon germanium (SiGe) or another semiconductor substrate used to fabricate integrated electronic circuitry. The semiconductor element 100 with the integrated electronic circuitry 10 may comprise conductive regions 20 wherein the conductive regions 20 are arranged between an etch stop layer 25 (see FIG. 2a) and a main side 50a of the semiconductor element. The semiconductor element with the integrated electronic circuitry may be fabricated, for example, in a complementary-metal-oxide-semiconductor (CMOS) or in a bipolar-complementary-metal-oxide-semiconductor (BiCMOS) process technology.

The semiconductor element 100 with the integrated electronic circuitry and the conductive region 20 may be processed in a CMOS process comprising, for example, well structures 104, an isolation layer 106, 60 a CMOS transistor layer, a silicon/metal 1 contact layer, a metal 1 (M1) layer, a metal 1/metal 2 contact layer, a metal 2 layer and at least one passivation layer 70. The isolation layer 106 or a part of same may be used as the above mentioned etch stop layer 25. According to other embodiments the CMOS process may comprise at least one, two, three or more metal layers.

According to other embodiments the semiconductor element and the electronic circuitry integrated therein, as well as, the conductive region may be formed in a bipolar-complementary-metal-oxide-semiconductor (BiCMOS) process technology. The process architecture for such a BiCMOS technology may, for example, comprise a buried layer, an epitaxial layer, a layer having wells, an isolation layer, a layer for connector terminals, a layer comprising CMOS/transistors structures, a polysilicon layer, a silicon/metal 1 contact layer, a metal 1 layer, a metal 2 contact layer, a metal 2 layer, at least one passivation layer. According to another embodiment the process architecture of a CMOS process or BiCMOS process may comprise more than two metal layers.

It should be noted that the process architecture of the CMOS process technology or the BiCMOS technology may comprise a different structure with less or additional layers or in a different sequence as exemplarily described above.

According to other embodiments, the semiconductor element and the electronic circuitry integrated therein may be processed in a different semiconductor process architecture, for example, in a bipolar technology, a smart power technology, a DRAM process technology, a CMOS-analog technology, a EEPROM process technology and the like. The semiconductor element 100 may be processed in a CMOS basis process that may be altered by modifying process modules or adding other process modules. Such a process module may comprise, for example, analog, EEPROM or DRAM processes. A semiconductor process may comprise a plurality of single process steps which may be integrated to certain process modules which are applied in the course of fabrication in order to realize a certain part of an integrated circuitry.

Usually, during a CMOS basic process first p- or n-wells may be manufactured in a well process module. Afterwards, an isolation for neighboring transistors is generated. This can be achieved, for example, by forming a so-called field oxide. Then, in regions that do not comprise field oxide, metal-oxide-semiconductor (MOS) transistors may be fabricated. In the back end of line, contacts and connections between the desired integrated circuitry are formed. This, may be performed by means of at least one metal or conductive layer, e.g. made of copper, aluminum, doped polysilicon and so on.

A conductive region 20 in the semiconductor element 100 may be formed during a metallization process. The conductive region 20 may be a buried metal layer or it may be a pad structure as an uppermost metallization layer at the main or upper side 50a of the semiconductor element.

If new specific process modules are added to a CMOS process, additional electronic functionalities can be realized in the semiconductor element. The electronic circuitry 10 in the semiconductor element 100 may, for example, also comprise sensor devices 12. Those sensor devices may be, for example, fabricated in a micro-electromechanical-structure (MEMS) technology. Such a sensor device 12 may be, for example, a pressure sensor, an accelerator sensor and so on.

The semiconductor substrate 105 may comprise n- or p-doped type regions which may ensure the correct functionality of the integrated electronic circuitry. The integrated electronic circuitry 10 may comprise transistor structures 8, sensor structures 12, diode structures, resistance structures, capacitance or inductive structures.

In one embodiment, the conductive region 20 may be a metallization which is robust to a temperature budget up to about 800° C. According to embodiments of the invention the conductive region may comprise a metal with a melting point higher than 700° C., higher than 800° C. or higher than 1000° C. The conductive region may be made of a metal which comprises, for example, a melting point higher than 700° C., e.g. between 700° C. and 1800° C., between 800° C. and 1600° C. or between 1000° C. and 1500° C. The conductive region 20 may comprise, for example, tungsten, copper, gold, platinum, osmium, iridium, rhodium, aluminum, niobium, tantalum, zirconium, hafnium, chrome, molybdenum, argentum, titanium or an alloy comprising two or more components. According to further embodiments the conductive region 20 may be made of a semiconductor material wherein the semiconductor material is n- or p-type doped.

In some embodiments the conductive region 20 may be a tungsten metallization combined with titanium (Ti)/titanium nitride (TiN) layers. This means, the conductive region 20 may comprise a titanium (Ti)/titanium nitride (TiN)/tungsten layer combination. The Ti/TiN layer may be a barrier layer that covers or enwraps at least partly the tungsten conductive region 20 so that a diffusion of the tungsten into the surrounding parts of the semiconductor element is suppressed or prevented. In other embodiments at least one barrier layer comprising a different suitable material, e.g. an oxide or a nitride, can be used to cover, line or enwrap the conductive region 20 so that a diffusion of the material of the conductive region into the remaining parts of the semiconductor element is suppressed, reduced or stopped. In some embodiments the barrier layer may at least partly cover the conductive region or may be at least partly be in contact with the conductive region 20.

In FIGS. 2a to 2e an embodiment for the method for forming a through via in a semiconductor element 100 is schematically depicted. It should be noted that other embodiments may comprise additional semiconductor process steps, e.g. etching, doping, masking, heating, polishing, grinding, printing, depositing, forming isolating layers, forming oxide layers, forming nitride layers, forming metallization layers, forming passivation layers and so on.

According to some embodiments the method for forming a through via 30 in a semiconductor element 100 may comprise providing 110 a semiconductor element 100 having electronic circuitry 10 integrated on a main side 50a thereof, wherein the semiconductor element 100 comprises a conductive region 20 at the main side. The reference numerals in FIGS. 2a to 2e refer to the explanations made in context to FIG. 1 and therefore, they are not repeated. According to embodiments an etch stop layer 25 may be arranged directly below the conductive region 20, as it is depicted in FIG. 2a. This means, parts of the conductive region 20 may be in direct physical contact to the etch stop layer 25. The etch stop layer may be arranged at the top of the semiconductor substrate main surface 105a. The conductive region 20 may be arranged between the etch stop layer 25 and the main side 50a of the semiconductor element 200. The etch stop layer 25 may be a thin layer, which comprises e.g. a thickness between 1 to 20 nm, 1 to 5 nm or less than 10 nm. The etch stop layer 25 may be made of an dielectric isolating material, e.g. an oxide, a nitride, e.g. silicon oxide or silicon nitride and so on. According to some embodiments the etch stop layer 25 is just arranged below the conductive region 20, if the conductive region is arranged closer to the main side than the etch stop layer. This means, the etch stop layer 25 is arranged between the conductive region 20 and the backside 50b of the semiconductor element 100.

The etch stop layer 25 may comprise at least a lateral dimension, which corresponds or is equal to the lateral dimension of the through hole 30 to be formed subsequently. It should be noted that according to other embodiments providing 110 may comprise a semiconductor element 100 which does not comprise such an etch stop layer 25. This means that in some embodiments the etch stop layer 25 is missing and the conductive region 20 itself may act as an etch stop layer during a subsequent etching.

According to embodiments of the invention the method for forming a through via in a semiconductor element 100 can be applied to wafers or semiconductor elements fabricated, e.g. within an integrated CMOS/BiCMOS process. The through via process can be designed modularly to a CMOS or BiCMOS process and can be applied, e.g. at the very end of CMOS or BiCMOS process. This means, according to some embodiments the method for forming a through via can be applied to a wafer or semiconductor element at a final stage of the production of the semiconductor element. In some embodiments the method for forming a through via can be applied to a wafer or a semiconductor element having at least the electronic circuitry formed therein. In this case, some process steps, e.g. a final wiring or a passivation of the wafer or semiconductor element, have to be done after the application of the method for forming a through via.

According to some embodiments at least one passivation layer 70, e.g. nitride or glass, e.g. phosphorous silicate glass (PSG) is deposited after the through via 35 is formed in the semiconductor element.

In FIG. 2b, selectively etching 120 a through hole 30 from a backside 50b of the semiconductor element 100 to the etch stop layer 25 or conductive region 20 is schematically depicted. The through hole 30 may extend from the backside to the etch stop layer 25 or to the conductive region 20. The backside 50b of the semiconductor element is opposite to the main side 50a of the semiconductor element. Etching 120 may be performed as wet or dry etching. A wet etching may be performed, for example, with KOH. The etching may be performed as anisotropic etching. The etching may be performed as a selective etching, a sputter etching, a reactive beam etching, a reactive ion etching, a plasma etching and so on. The etching may be performed by means of reactive ion etching or deep reactive ion etching (DRIE). The etching may be performed with a high aspect ratio, for example, up to 50:1. The etching may be performed using a BOSCH-process. According to embodiments, etching 120 of the semiconductor substrate 105 from the backside 50b of the semiconductor element 100 may be stopped at the etch stop layer 25 or at the conductive region 20. The conductive region 20 may comprise a metal with a high temperature budget or a melting point higher than 800° C. The semiconductor substrate 105 may comprise a higher etch selectivity than the etch stop layer 25 or the conductive region 20 with respect to the etchant. This means, the etching rate of the semiconductor substrate 105 may be higher than an etching rate of the etch stop layer 25 or the conductive region 20.

In some embodiments the semiconductor element 100 does not comprise an etch stop layer 25 and etching 120 is stopped directly at the conductive region 20. The conductive region may be, for example, made of tungsten, an other metal or an alloy comprising a melting point higher than 800° C., 1000° C. or 1500° C. The conductive region 20 may comprise with respect to the etchant a different etch selectivity compared to the semiconductor substrate 105. The conductive region 20 may serve as an etch stop layer. Etching 120 may be performed as an anisotropic etching, with a high aspect ratio up to 30:1, 50:1 or even 80:1.

Referring to FIG. 2c, according to some embodiments the method for forming a through via 35 in a semiconductor element may further comprise removing 130 at least partly the etch stop layer 25, so that the conductive region 20 is exposed to the backside 50b of the semiconductor element. This means, the etch stop layer 25 may be removed so that the conductive region 20 is uncovered in the lateral dimension of the through hole 30. In order to achieve an electrical connection from the backside to the conductive region 20 at the main side 50a of the semiconductor element the etch stop layer 25 can be at least partly removed. Removal can be performed, for example, by etching using wet and/or dry etching, as described in context to FIG. 2b. In this case, etching may comprise a higher selectivity to the etch stop layer than to the surrounding material, e.g. the semiconductor substrate 105. This means, etching attacks with a higher selectivity the etch stop layer than the semiconductor substrate 105 or the conductive region 20. The etch stop layer 25 may comprise a small thickness, for example, 0.5 nm to 5 nm. The etch stop layer 25 may be removed at least partly in the region of the through hole 30.

As it is schematically depicted in FIG. 2d, parts of the etch stop layer 25 may still remain in the semiconductor element 100. After removing 130 at least parts of the etch stop layer 25 the conductive region 20 is exposed to the backside 50b of the semiconductor element 100.

Still referring to FIG. 2d, according to some embodiments, the method for forming a through via 35 may comprise generating 140 an isolation layer 60 at least on the side walls of the through hole 30 in the semiconductor substrate 105. Generating 140 an isolation layer 60 may be performed such that at least parts of the backside 50b are covered with the isolation layer 60. The isolation layer 60 may cover the backside 50b and at least the side walls of the through hole 30. Generating an isolation layer 140 may be performed such that the conductive region 20 is still exposed to the backside to the semiconductor element. This means, according to some embodiments that the isolation layer 60 does not cover the exposed region or contact region 20a of the conductive region 20. The generation of the isolation layer 60 may be performed using, e.g. a chemical vapor deposition (CVD) technique. For example, a low-pressure-chemical-vapor-deposition (LPCVD) may be applied in order to generate the electrically isolation layer 60. By means of a LPCVD process a Tetra-Ethyl-Ortho-Silicate (TEOS) may be processed at a temperature between 600° C. and 1000° C., or between 700° C. and 900° C., so that a silicon dioxide layer is deposited as isolation layer 60. According to other embodiments, either low or high temperature CVD techniques may be used to form the isolating layer 60. The isolation layer 60 may be, for example, a nitride layer, an organic or a polymeric layer.

In FIG. 2e, filling 150 at least parts of the through hole 30 with a conductive material 80 is schematically depicted. The conductive material 80 may be made of, e.g. metal, metal compound, an alloy or a doped semiconductor material. Filling 150 may be performed so that at least the side walls of the through hole 30 are covered with the conductive material 80. In other embodiments the through hole 30 may be completely filled with the conductive material 80 so as to form the through via 35. The conductive material 80 is electrically isolated from the semiconductor element 100 or the semiconductor substrate 105. An electrical isolation may be achieved by means of the above mentioned isolation layer 60. The through hole 30 may be filled completely or at least partly with the conducive material 80 so as to form the through via 35. Filling 150 may be performed by applying a known-technique in the semiconductor process technology to deposit a conductive material, e.g. a metal on a semiconductor element. Such a technique may comprise, for example, physical-vapor-deposition (PVD), thermal vapor deposition, chemical-vapor-deposition, metal-organic-chemical-vapor-deposition (MOCVD), sputtering and so on. The conductive region 20 may be spaced apart from the semiconductor substrate main surface 105a by a gap 77 which may correspond to the thickness of the etch stop layer 25.

According to some embodiments the conductive material 80 may comprise a doped silicon material, like a n- or p-type doped polysilicon. Filling 150 may be performed such that the backside 50b of the semiconductor element is additionally at least partly covered with the conductive material 80.

Accordingly, in some embodiments, the method for forming a through via 35 may further include structuring the conductive material 80 at the backside 50b of the semiconductor element 100. Structuring may include the step of masking and etching the conductive material at the backside 50b of the semiconductor element. Structuring of the conductive material 80 may be performed in a manner which is known in the semiconductor process technology.

Moreover, at least one barrier or passivation layer 70 may be formed at the surface of the main side in order to passive the semiconductor element. Such a barrier or passivation layer 70 may comprise, for example, oxide, nitride, organic material, polymeric material or glass, e.g. a silicate glass like PSG or BPSG. According to some embodiments the through via process may be applied at the very end of the wafer or semiconductor element processing.

In addition, during the fabrication of the semiconductor element having an electronic circuitry integrated, a metallization may be applied to the integrated wafer manufacturing process. The metallization may be robust to temperature budgets up to about 800° C. The metallization may comprise a melting point higher than 800° C., 1000° C. or 1500° C. One example may be a tungsten metallization combined with Ti/TiN layers. The titanium or the titanium nitride may be deposited to line or enwrap the outer surface of the conductive region 20 so that the diffusion of the tungsten into the semiconductor element is suppressed or reduced. Furthermore, the through hole 30 may be etched from the backside of the wafer with an etch stop at the tungsten metallization combined with the Ti/TiN layer or alternatively at an edge stop layer which may comprise, for example, oxide or nitride.

According to some embodiments a low temperature oxide isolation 60 may be deposited to the through hole, for example, based on an TEOS-process. Afterwards the through hole may be at least partly filled with a metal. Therewith the through via is formed. Depending on the filling, a subsequent structuring of the metal filling on the backside of the semiconductor element or wafer may be performed.

Although embodiments have been described and illustrated in detail in the FIGS. 1 to 2e, it is to clearly understood that same is by way of illustration and example only, and is not to be taken by way of limitation. The spirit and scope of the present invention are to be limited only by the terms of the appended claims.

The invention claimed is:
1. A method for forming a through via in a semiconductor element, the method comprising:
providing a semiconductor element having an electronic circuitry integrated on or in a main side thereof, the semiconductor element comprising an etch stop layer and a conductive region, wherein the conductive region is arranged between the etch stop layer and the main side of the semiconductor element;
selectively etching a through hole from a backside of the semiconductor element, opposite to the main side of the semiconductor element, to the etch stop layer, thereby exposing a portion of the etch stop layer in the through hole;
removing the exposed portion of the etch stop layer in the through hole in order to expose the conductive region to the backside of the semiconductor element; and
filling at least partially the through hole with a conductive material so as to form the through via, wherein the conductive material is electrically connected to the conductive region and electrically isolated from the remaining semiconductor element,
wherein the provision of the semiconductor element is performed so that the conductive region comprises a metal with a melting point higher than 700° C.

2. The method according to claim 1, further comprising generating an electrically isolating layer on at least the side walls of the through hole before filling the through hole with the conductive material.

3. The method according to claim 2, wherein the electrically isolating layer is generated by performing low-pressure chemical-vapor-deposition (LPCVD) using a Tetra-Ethyl-Ortho-Silicate (TEOS) so that a silicon oxide isolating layer is formed.

4. The method according to claim 1, wherein the filling is performed, so that at least a part of the backside of the semiconductor element is covered with conductive material, and the method further comprises structuring the conductive material on the backside of the semiconductor element.

5. The method according to claim 1, wherein the electronic circuitry comprises a Micro-Electro-Mechanical-System (MEMS)-structure, a sensor devices, a transistor, a diode, a resistor, a capacitor or an inductor.

6. A method for forming a through via in a semiconductor element, the method comprising:
providing a semiconductor element having an electronic circuitry integrated on or in a main side thereof, the semiconductor element comprising an etch stop layer and a conductive region, wherein the conductive region is arranged between the etch stop layer and the main side of the semiconductor element;
selectively etching a through hole from a backside of the semiconductor element, opposite to the main side of the semiconductor element, to the etch stop layer, thereby exposing a portion of the etch stop layer in the through hole;
removing the exposed portion of the etch stop layer in the through hole in order to expose the conductive region to the backside of the semiconductor element; and filling at least partially the through hole with a conductive material so as to form the through via, wherein the conductive material is electrically connected to the conductive region and electrically isolated from the remaining semiconductor element,
wherein the provision of the semiconductor element is performed so that the conductive region comprises tungsten.

7. A method for forming a through via in a semiconductor element, the method comprising:
providing a semiconductor element having an electronic circuitry integrated on or in a main side thereof, the semiconductor element comprising an etch stop layer and a conductive region, wherein the conductive region is arranged between the etch stop layer and the main side of the semiconductor element;
selectively etching a through hole from a backside of the semiconductor element, opposite to the main side of the semiconductor element, to the etch stop layer, thereby exposing a portion of the etch stop layer in the through hole;
removing the exposed portion of the etch stop layer in the through hole in order to expose the conductive region to the backside of the semiconductor element; and filling at least partially the through hole with a conductive material so as to form the through via, wherein the conductive material is electrically connected to the conductive region and electrically isolated from the remaining semiconductor element,
wherein the provision of the semiconductor element is performed so that at least one barrier layer separates a surface of the conductive region from the semiconductor element in order to suppress a diffusion of the conductive region material into the semiconductor element.

8. A method for forming a through via in a semiconductor element, the method comprising:
providing a semiconductor element having electronic circuitry integrated on or in a main side thereof, the semiconductor element having a conductive region at the main side, wherein the conductive region comprises tungsten;
etching a through hole from a backside of the semiconductor element, opposite to the main side of the semiconductor element, to the conductive region, and
filling at least partially the through hole with a conductive material so as to form the through via, so that the conductive material is electrically connected to the conductive region and electrically isolated from the remaining semiconductor element.

9. The method according to claim 8, wherein the conductive region comprises a titanium/titanium nitride/tungsten layer combination.

10. The method according to claim 8, further comprising performing a Low-Pressure-Chemical-Vapor-Deposition (LPCVD) to the through hole, thereby generating an isolation layer on sidewalls of the through hole so that an electrical isolation of at least the side walls of the through hole is formed.

11. A method for forming a through via in a semiconductor element, the method comprising:
providing a semiconductor element having electronic circuitry integrated on or in a main side thereof, the semiconductor element comprising a conductive region at the main side;
etching a through hole from the backside of the semiconductor element, opposite to the main side of the semiconductor element, to the conductive region,
performing a Low-Pressure-Chemical-Vapor-Deposition (LPCVD) to the through hole, thereby forming an isolation layer on sidewalls of the through hole, so that an electrical isolation of at least side walls of the through hole is formed; and
filling the through hole at least partially with a conductive material so as to form the through via, wherein the conductive material makes electrical contact to the conductive region,
wherein the provision of the semiconductor element is performed so that the conductive region comprises a metal with a melting point higher than 700° C.

12. The method according to claim 11, wherein the semiconductor element further comprises an etch stop layer, wherein the conductive region is arranged between the etch stop layer and the main side of the semiconductor element; and
wherein the method further comprises removing a portion of the etch stop layer after etching the through hole, so that the conductive layer is exposed to the backside of the semiconductor element.

* * * * *